United States Patent
Lorin et al.

(10) Patent No.: US 6,545,290 B2
(45) Date of Patent: *Apr. 8, 2003

(54) POLYMER SEMICONDUCTOR DEVICE COMPRISING AT LEAST A RECTIFYING FUNCTION AND METHOD FOR MAKING SAME

(76) Inventors: André Lorin, 1, allie de bois de la Cyprenne, 21400 Orsay (FR); Céline Fiorini, Fbis, welle des Saules, 21400 Orsay (FR); Jean-Michel Nunzi, 7 rue d Aquitaine, 92160 Antony (FR); Carole Sentein, 37, avenue Paup Langevin, F-92260 Fontenay aux Roses (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/355,923
(22) PCT Filed: Feb. 5, 1998
(86) PCT No.: PCT/FR98/00212
§ 371 (c)(1),
(2), (4) Date: Aug. 20, 1999
(87) PCT Pub. No.: WO98/35393
PCT Pub. Date: Aug. 13, 1998

(65) Prior Publication Data
US 2003/0010973 A1 Jan. 16, 2003

(30) Foreign Application Priority Data
Feb. 10, 1997 (FR) .............................. 97 01485

(51) Int. Cl.[7] .............................................. H01L 33/00
(52) U.S. Cl. ........................ 257/40; 257/102; 257/103; 257/228
(58) Field of Search .................... 257/40, 102, 103, 257/225, 228; 313/504, 503, 502; 136/263

(56) References Cited

U.S. PATENT DOCUMENTS

| 4,435,610 | A | | 3/1984 | Perlman et al. |
| 4,818,857 | A | | 4/1989 | Micheron et al. |
| 5,126,214 | A | * | 6/1992 | Tokailin et al. ............. 428/690 |
| 5,729,641 | A | * | 3/1998 | Chandonnet et al. .......... 385/2 |
| 5,814,416 | A | * | 9/1998 | Dodabalapur et al. ...... 428/690 |
| 5,825,524 | A | * | 10/1998 | Faderl et al. ................ 359/245 |
| 5,834,130 | A | * | 11/1998 | Kido ........................... 428/690 |
| 5,895,932 | A | * | 4/1999 | Bojarczuk, Jr. et al. .... 257/103 |
| 5,955,209 | A | * | 9/1999 | Murata et al. .............. 428/690 |

FOREIGN PATENT DOCUMENTS

EP     0 460 242     12/1991

OTHER PUBLICATIONS

Schildkraut (Photoconducting electro–optic polymer films, Applied Physics Letters,.58(4), 1991).*

(List continued on next page.)

*Primary Examiner*—Eddie Lee
*Assistant Examiner*—N. Drew Richards
(74) *Attorney, Agent, or Firm*—Oblon, Spivak, McClelland, Maier & Neustadt, P.C.

(57) ABSTRACT

A semiconductor device made of polymer. The device includes at least one rectifying function formed by a layer of polymer between a first and a second electrode. The layer of polymer forms a host matrix for polar molecules with the polar molecules being electrically oriented in a direction perpendicular to the electrodes. The electrical charges of the polar molecules of the same sign are directed towards the same electrode. The method of producing such a device is also included.

14 Claims, 4 Drawing Sheets

OTHER PUBLICATIONS

D. Wöhrle, et al., Advanced Materials, No. 3, pp. 129–138, "Organic Solor Cell," 1991.

Ren W. et al., Optimized Poling Of Nonlinear Optical Polymers Based On Dipole—Orientation and Dipole—Relaxation Studies, Journal of Applied Physics, vol. 75, No. 11, Jun. 1, 1994, pp. 7211–7219.

Schildkraut, J.S., Photoconducting Electro–Optic Polymer Films, Applied Physics Letters, vol. 58, No. 4, Jan. 28, 1991, pp. 340–342.

Sentein C. et al., Study of Orientation Induced Molecular Rectification in Polymer Films, Jun. 16–19, 1997, vol. 9, No. 1–4, pp. 316–322.

* cited by examiner

POLYMER SEMICONDUCTOR DEVICE COMPRISING AT LEAST A RECTIFYING FUNCTION AND METHOD FOR MAKING SAME

BACKGROUND OF THE INVENTION

The invention relates to a semiconductor device made of polymer that includes at least one rectifying function. In particular it relates to diodes and notably photovoltaic and electroluminescent diodes. It also relates to devices such as transistors.

DISCUSSION OF THE BACKGROUND

The use of polymers to produce semiconductor devices is technically rather interesting. In effect, the polymers can be formed by a wet method from a solution, which leads to techniques which are easy to implement, that are low cost and which are compatible with other techniques.

In order to produce semiconductor devices such as electroluminescent diodes and photovoltaic cells, it is usually appropriate to create a junction. This can be a Schottky junction obtained by bringing a doped semiconductor into contact with a metal having a rectifier contact with the semiconductor used. It may also be a pn junction obtained by placing a p type semiconductor at the side of an n type semiconductor. The junction is called a homo-junction if the semiconductor material is the same for the whole of the junction. In the contrary case, one speaks of a heterojunction.

It is known to use polymers to produce these two types of diode (Schottky and pn junction). As a function of the type of conductivity required, p or n, it is preferable to chemically dope the polymer with atoms (or molecules) that are respectively acceptors or donors of electrons.

A disadvantage of Schottky diodes produced by the juxtaposition of a metal and a polymer is their short life. This is due to the diffusion of the metal into the polymer where the two materials are in contact, because of the difference in the electrochemical potential that exists between these two materials.

Logically, a pn junction should allow this disadvantage to be remedied. It is produced by the juxtaposition of a type p polymer and a type n polymer. However, it is extremely difficult to produce such pn junctions since the choice of the different polymers is not always compatible with the operational imperatives. Furthermore, type n type polymers are not very common and are often unstable to oxygen.

Another problem inherent to polymer diodes of both of these types (Schottky and pn) is linked to the small breadth of the depletion layer at the junction which is less than 20 nm. So as to avoid short circuits between the electrodes, the devices made up of thin layers of polymer are produced with a thickness greater than or equal to 100 nm. As the mobility $\mu$ of the charges within the organic components is a function that increases rapidly with the internal electric field E of the semiconductor in accordance with the empirical law $$\mu = \mu_o \cdot exp[(E/E_o)^p]$$

where the exponent p is close to 0.5 and as the internal field E is only large within the depletion layer, the electrical charges do not pass well in polymer semiconductor devices of the known art. This leads to low efficiency for these devices.

SUMMARY OF THE INVENTION

This invention allows these disadvantages to be remedied. It consists of creating a rectifying homo-junction gradient equivalent to a pn junction in a single thin layer of polymer which is used as a host matrix for polar molecules orientated in an appropriate manner. The result is a significant increase in the mobility of the carriers within the entire thickness of the layer which leads to a uniformly distributed depletion layer. This principle in a significant way, improves the performance of the devices with a junction such as electroluminescent diodes, photocells and transistors produced from polymers.

Therefore a first subject of this invention consists of a semiconductor device made of polymer that includes at one rectifying function, characterized in that the function is produced by a layer of polymer between first and second means that form electrodes, the layer of polymer constituting a host matrix for polar molecules, the polar molecules being electrically orientated in a direction perpendicular to the first and second means forming the electrodes, the electrical charges of the polar molecules of same sign being directed towards the same means that form an electrode.

A second subject of this invention consists of a method of producing a polymer semiconductor device that includes at least one rectifying function, characterized in that it includes the following steps:

formation of a layer based on polymer and including polar molecules, the polymer constituting a host matrix for the polar molecules, orientation of the polar molecules in the host matrix so that the electrical charges of the polar molecules of same sign are directed to the same side.

BRIEF DESCRIPTION OF THE DRAWINGS

The invention will be better understood and other advantages and particular features will become apparent on reading the description that will follow, given by way of a non-limitative example and accompanied by the appended figures among which

DETAILED DESCRIPTION OF THE PREFERRED EMBODIMENTS

Figure 1:
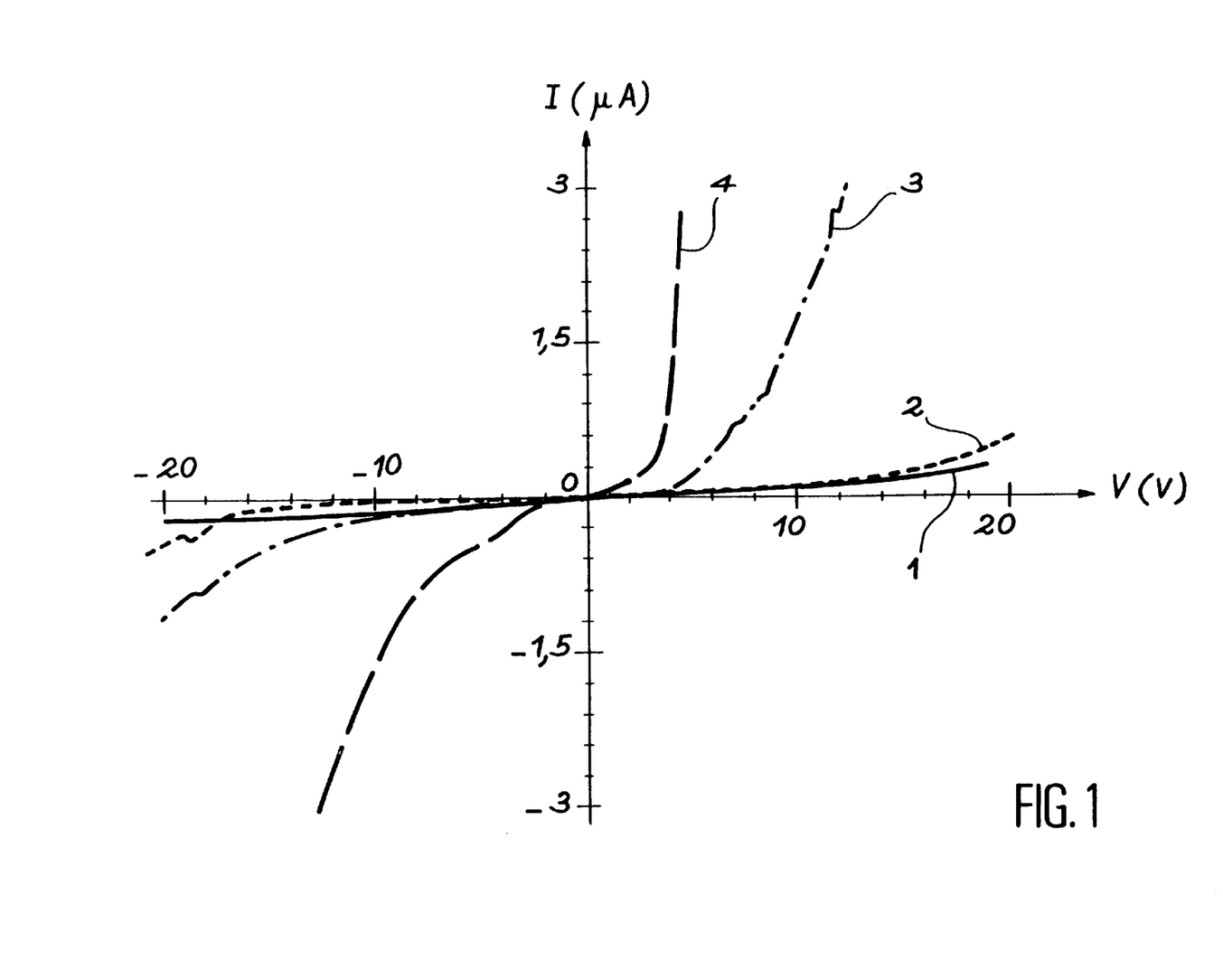
FIG. 1 is a current-voltage diagram of a structure comprising a layer of polymer placed between two electrodes.
Figure 2:
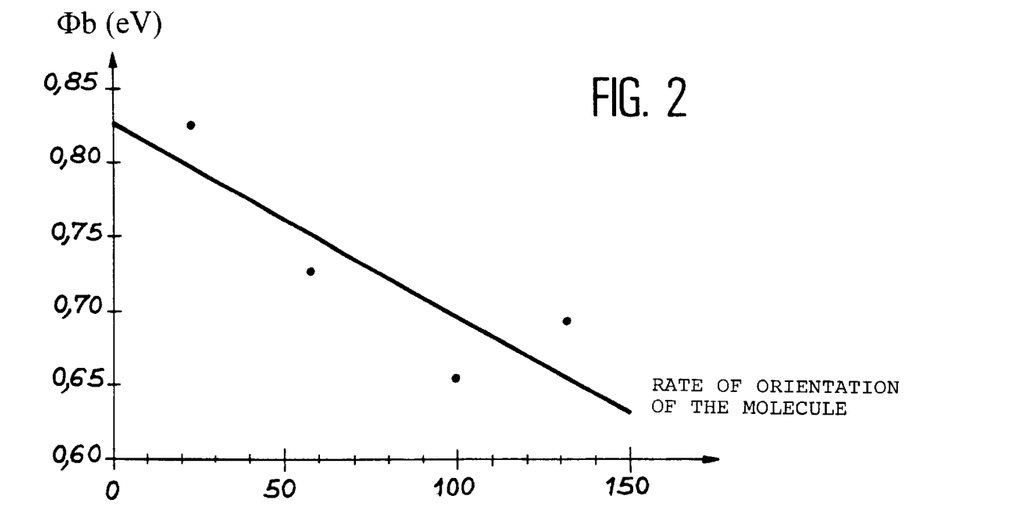
FIG. 2 is a diagram representing the variation in the height of the potential barrier between an electrode and the polymer layer of a structure according to the invention as a function of the rate of orientation of the polar molecules.
Figure 3:
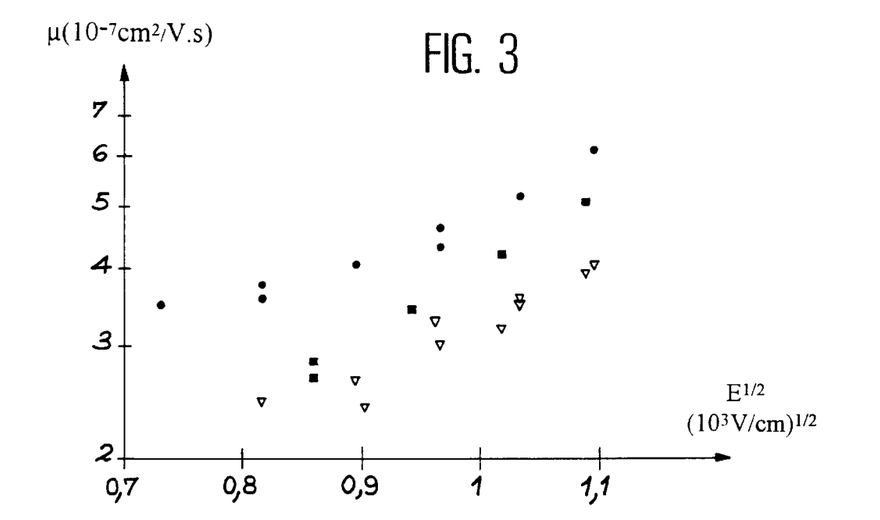
FIG. 3 is a diagram representing the mobility of the electrons in a structure according to the invention before polarization and for two opposite values of the polarization field.

The diagrams in FIGS. 1, 2 and 3 allow one to illustrate the principle which lies at the base of this invention. They relate to a symmetrical diode made up of a thin film of polymer semiconductor situated between two electrodes of the same kind and including polar organic molecules. The thin film is a copolymer (MMA-DR1) 50/50 which will be defined below, the MMA playing the role of host matrix and the DR1 constituting the polar molecules. The electrodes are made of aluminum.

Initially, the structure constituted in this way is perfectly symmetrical as its current-voltage characteristic taken at ambient temperature and represented by curve 1 in the diagram in FIG. 1 shows. The principle which forms the basis of this invention consists of inducing a rectifying diode function of the pn type by modification of the nature of the polymer layer situated between the electrodes. The modification is carried out by the orientation of the polar molecules in the host matrix. By applying a static electric field to the thin film and simultaneously bringing this thin film to a temperature close to its vitreous transition temperature Tg, the polar molecules quantitatively orientate themselves in accordance with the electric field. This orientation is frozen by maintaining the static electric field during the cooling phase of the structure. It is possible to directly link the internal field induced in the polarized structure to the rate of orientation of the polar molecules.

The effect of the orientation of the polar molecules is apparent from the curves on the I f(V) diagram in FIG. 1. Curve 1 showing the current-voltage characteristic before polarization of the structure, curve 2 shows the current-voltage characteristic of a similar structure obtained after polarization by 5 V, at a temperature of 130° C. for 10 minutes, curve 3 shows the current-voltage characteristic of a similar structure obtained after polarization by 10 V, at a temperature of 130° C. for 10 minutes and curve 4 shows the current-voltage characteristic of a similar structure obtained after polarization by 15 V, at a temperature of 130° C. for 10 minutes. The rectifying effect, after polarization at a temperature close to the vitreous transition temperature is clearly apparent on the diagram in FIG. 1.

By taking the classical model for the Schottky diode for the semiconductors, one can make a theoretical adjustment to the current-voltage curves by using the usual parameters:

$$I=I_S[exp(qV/nkT)-1]$$

with $I_S$: saturation current

V: applied voltage n: ideality factor q: charge of the electron k: Boltzmann constant T: absolute temperature In this way, for each of the values of the polarization of the structure, the saturation current can be estimated. By analogy with mineral semiconductors, one can then calculate $\phi_b$, the metal-semiconductor barrier potential through the following equation $$I_S=AR^*T^2 \, exp(-q\phi_{b/kT})$$

with

A: area of the diode

R*: Richardson constant $$R^*=4\pi m_e q k^2/h^3$$

The value $\phi_b$ is compared with measurements of the rate of orientation carried out by generation of a second harmonic. These measurements of the rate of orientation can be carried out as described in the thesis of G. GARDET entitled "Non-linear optical properties of polarized polymers: a study of the chromatic dispersion of their electro-optical coefficient by modulation of the reflectivity" and supported by The University of Paris XI in 1993. The variation in the height of the metal/organic semiconductor potential barrier is thereby linked to the rate of orientation of the molecules in the matrix of the polymer.

FIG. 2 shows that, by orientation of the molecules, a function has been produced equivalent to a pn junction with an internal potential difference close to 0.2 eV. There is a homo-junction gradient spread over the entire thickness of the film of polymer.

In FIG. 1, it should also be noted that in addition to the rectifying effect (asymmetry of the characteristic), the conductivity of the diode in the on state (diode positively polarized) is significantly increased after orientation of the molecules. This effect is confirmed by measurement of the flight time. This measurement permits the determination of the type of conduction of a material (n conduction if the electrons are the major carriers, or p if the holes are) and the mobility of the charges.

The diagram in FIG. 3 shows the results obtained for the mobility of the electrons before and after orientation of the molecules for two opposite values of the polarization field applied at 130° C. The mobility on the diagram in FIG. 3 is drawn as a function of the electric field E applied during the measurement. The law of mobility $$\mu=\mu_o\cdot exp[(E/E_o)^{1/2}]$$

is verified. The increase in the mobility of the electrons is asymmetric. It goes in the direction of the rectifying effect induced.

In the diagram in FIG. 3, the mobility $\mu$ of the electrons is on the y-axis and the electric field E is on the x-axis. In the diagram in FIG. 3, the points marked with triangles represent the mobility of the electrons before polarization by an electric field, the points marked with squares represent the mobility of the electrons after polarization resulting from the application of a negative voltage of 100 V, for 5 minutes at 130° C., the points marked with solid circles represent the mobility of the electrons after polarization resulting from the application of a positive voltage of 100 V, for 5 minutes at 130° C.

The diagram in FIG. 3 shows that, by orientation of the molecules, the electronic mobility $\mu_o$ in the on direction without an applied external field is increased by a factor of 4. This effect is fundamental for the performance of semiconductor devices of the photocell type and electroluminescent diode type.

It is advantageous to use, as polar molecules, active organic molecules derived from the field of non-linear quadratic optics. They are of the "push-pull" type, that is to say they have both an electron donor group (of the amino type) and an electron acceptor group (of the nitro type), separated from one another by one or more groups comprising conjugated π electron systems, which are therefore capable of being displaced over several atoms (diazobenzene in the case of the DR1 molecule, for example). This type of molecule is fully described in "Molecular Nonlinear Optics: materials, physics and devices", published by J. ZYSS at Academic Press Inc. (1994), "Organic Nonlinear Optical Materials", Vol. 1, by Ch. BOSSHARD, K. SUTTER, Ph. PRETRE, J. HULLIGER, M. FLORSHEIMER, P. KAATZ, P. GUNTER, published by Gordon and Breach Publishers, (1995) and in the document FR-A-2 732 482 that discloses a "Method of manufacturing structures made of transparent, organic polymers auto-organized for the conversion of an optical frequency", by F. CHARRA, C. FIORINI, A. LORIN, J-M. NUNZI and P. RAIMOND.

An example of a polar molecule is Disperse Red 1 (DR1): 4-[N-(2-hydroxyethyl)-N-ethyl]-amino-4'-nitroazobenzene (Aldrich, recrystallized) which has the following chemical structure:

This molecule can be used in a photocell as a photogenerator of charges.

Another example of a polar molecule is DCM: 4-(dicyanomethylene)-2-methyl-6-(p-dimethylaminostyryl)-4H-pyrane (Exciton) which has the following chemical structure

This molecule can be used in an electroluminescent diode as an emitter of red light at 620 nm.

The polymer that is suitable to use is advantageously soluble. It must have significant carrier mobility after the inclusion of active molecules by doping or by grafting onto the main chain. It may be a semiconductor polymer such as those described in the "Handbook of Conducting Polymers", published in two volumes by SKOTHEIM in 1986 at Marcel Dekker. The soluble derivatives of polythiophene (PT), polyparaphenylene (PPP) and polyparaphenylenevinylene (PPV) are examples. It may also be one of a number of polymers that become semiconductors through doping, for example polymethyl methacrylate (PMMA), polyvinyl carbazole (PVK), polycarbonate (PC), polystyrene (PS) and polyvinyl chloride (PVC).

For example, polymethyl methacrylate (PMMA) is used as an isotropic matrix polymer that is optically inactive and transparent in the visible and near infra-red. Its chemical formula is as follows The active molecule can be chemically attached (grafted) to the polymer. Hence, the copolymer DR1-MMA grafted with 50 mol. % of chromophors (50/50 DR1-MMA) is obtained by free radical polymerization from a solution of methyl methacrylate (MMA) and N-ethyl-N-(methacryloxyethyl)-4'-amino-4-nitroazobenzene (derivative of DR1). This material has a vitreous transition temperature close to 132° C. Its formula is as follows:

n=0.50

The semiconductor device according to this invention allows one to produce a photocell (photovoltaic cell). A traditional way of producing a photocell is described in the article "organic Solar Cells" by D. WOHRLE and D. MEISSNER, published in Advanced Materials, Vol. 3 (1991), No. 3, pages 129–138.

Figures 4, 5:
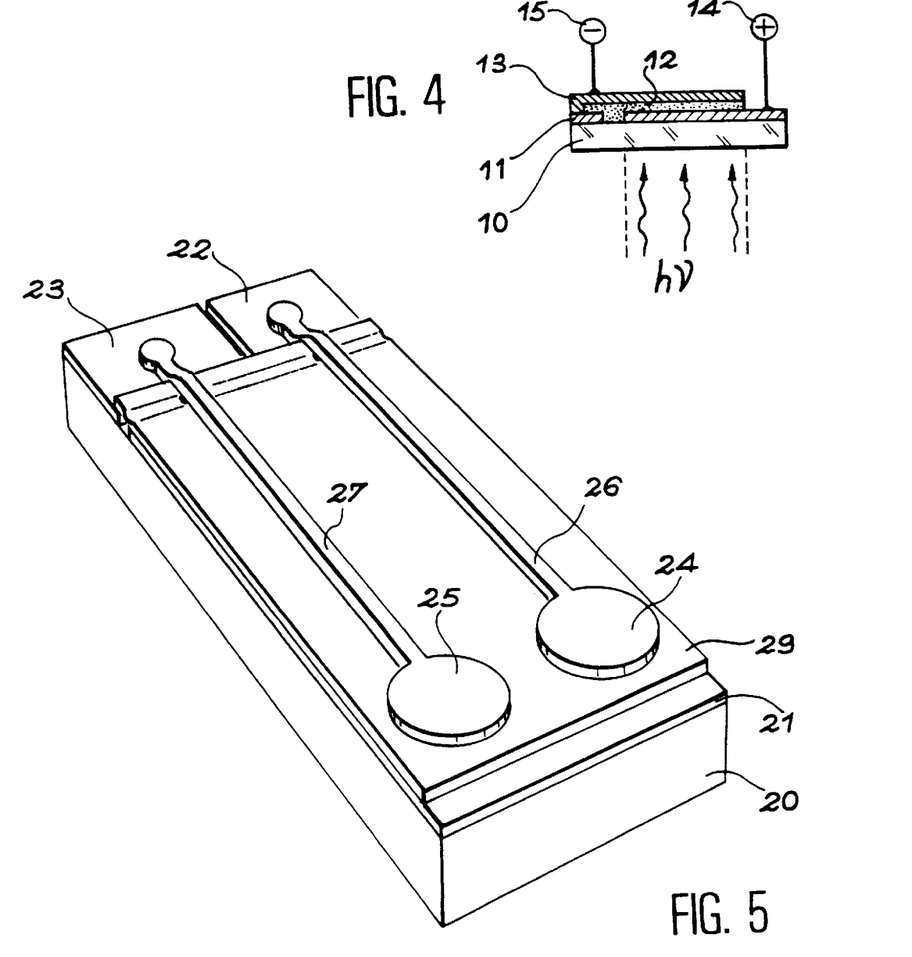
FIG. 4 represents a side view of a photocell according to this invention.
FIG. 5 is a perspective view of a photocell device according to this invention.

The photocell according to the invention is shown diagrammatically in FIG. 4. It includes a transparent substrate 10, for example, made of glass, that supports a transparent electrode 11, for example made of mixed oxide of tin and indium (ITO electrode). A layer of organic semiconductor 12 constituted by a polymer that includes polar molecules is between the transparent electrode 11 and a metal electrode 13, for example, an aluminum electrode. The electrodes 11 and 13 are respectively connected to output terminals 14 and 15. In operation, the light indicated by arrows in FIG. 4 is absorbed through the transparent face of the photodiode. Electrical charges are then photo-generated close to the interface between the transparent electrode 11 and the polymer layer 12. The electric field inside the structure, which is induced by the orientation of the polar molecules contained in the polymer host matrix, encourages the separation of the charges and the movement of one of the carriers towards the aluminum electrode. A current is then generated.

For an embodiment more capable of industrial production, a substrate can be used that is made up of a standard sheet of glass, covered with ITO (Conductin 013 A treatment from Balzers) of resistance equal to 13 Ω/□, and of thickness equal to 1 mm. The conductive coating is then etched by laser attack in accordance with the configuration illustrated in FIG. 5 where reference number 20 designates the sheet of glass. The laser ablation divides the conductive and transparent coating into three parts 21, 22 and 23. After cleaning with a traditional detergent (TDF4), the parts 21, 22 and 23 are rinsed with distilled water and then subjected to several cycles of ultrasound treatment. The substrate made up of the sheet of glass and its conductive coating is then heated in an oven to 400° C. in such a way as to remove by pyrolysis any possible residual organic impurities.

The organic film is obtained by centrifuging the polymer solution onto the substrate (trammel deposition). The thickness of the layer and its homogeneity depend on the rotation parameters of the trammel and the viscosity of the solution. The apparatus is regulated in both ways.

Films of thickness 0.13 μm are obtained from a solution of 50/50 (MMA-DR1) copolymer at 30 g/l in 1,1,2-trichloroethane. The solution is filtered at the moment of deposition through a 0.5 μm filter. The centrifuging parameters are the following Deposition phase:
    first acceleration
    200 rpm/sec first cycle: 110 rpm for 10 sec, Drying Phase:

second acceleration 300 rpm/sec, second cycle 5000 rpm for 50 sec.

After deposition, the substrate covered with the thin film is cured for 15 minutes at 80° C. which allows any residual solvent to be removed. Measurement of the thickness is carried out with the help of a Veeco model Dektak 3ST profile meter.

The left part of the thin film corresponding to parts 22 and 23 is then partially scraped in order to lay bare those parts 22 and 23 which will be used as electrical contact points. Similarly, the extreme right part of the thin film is also scraped to facilitate making contact.

Then, as can be seen in FIG. 5, electrodes 24 and 25 made of aluminum are deposited on the thin organic film 29 by evaporation through a mask. The vaporization is carried out under vacuum at $1.33 \times 10^{-4}$ Pa ($10^{-6}$ Torr). It allows the simultaneous deposition of conductive strips 26 and 27 that provide the electrical connection between electrodes 24 and 25 and the contact points 22 and 23 respectively. Two photocells are obtained with a unitary surface area of 38 mm$^2$ and having a common electrode formed by the conductive part 21.

The device obtained is then brought to a temperature of 130° C. and a voltage of 15 volts is applied to each diode for 10 minutes. Then temperature regulation of the device is stopped while all the time keeping the same polarization voltage applied. The temperature of the device is allowed to fall again to 25° C. in 30 minutes. The static applied electric field is then switched off.

The effect of the colorant DR1 is that the major charge carriers in the 50/50 MMA/DR1 copolymer are the electrons (type n material). Their mobility is therefore increased by orientating the DR1 chromophors with their electron donor groups (amino groups) on the side of the ITO coating and their electron accepting groups (nitro groups) on the side of the aluminum electrode. This is achieved by applying a voltage V with a positive value to the ITO coating during the polarization phase. More generally, for a polymer film of the same composition and different thickness, the device will be polarized with a voltage V close to 100 V/$\mu$m.

The photocell thus described generates a current of electrons to the aluminum electrode when it is illuminated with white light on its transparent face.

The semiconductor device according to this invention also allows the production of an electroluminescent diode. A traditional way of producing an electroluminescent diode is described in the article "Blue Light Emitting Diodes with Doped Polymers" by E. GAUTIER, J. -M. NUNZI, C. SENTEIN, A. LORIN and P. RAIMOND published in Synthetic Metals, Vol. 81, 1996, p. 197–200.

Figure 6:
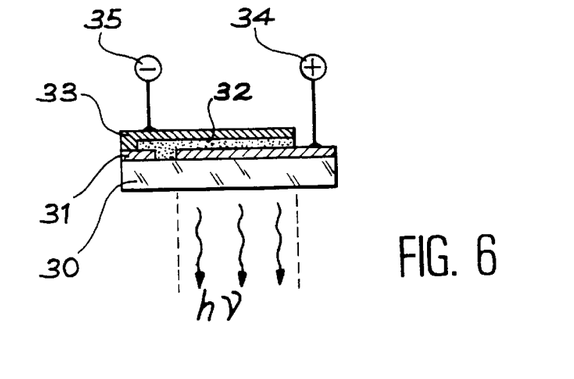
FIG. 6 represents a side view of an electroluminescent diode according to the present invention.

An electroluminescent diode according to this invention is shown diagrammatically in FIG. 6. Its structure is identical to that in FIG. 4. It comprises a transparent substrate 30, for example made of glass, supporting a transparent electrode, for example an ITO electrode. A layer of organic semiconductor 32 made up of a polymer including polar molecules is between the transparent electrode 31 and a metal electrode 33, for example made of aluminum. The electrodes 31 and 33 are respectively connected to input terminals 34 and 35. In operation, light, indicated by arrows in FIG. 6, is emitted through the transparent face of the electroluminescent diode.

When the diode is subjected to a positive voltage on the transparent electrode 31, charges are injected through the two electrodes 31 and 33 into the polymer 32. On recombining, these charges emit light through the transparent face of the device. The electric field inside the structure, which is induced by the orientation of the polar molecules contained in the host polymer matrix, encourages the injection of the charges and their recombination in +/− pairs in the polymer. In effect, this internal field restricts the direct transit, without recombination, of charges from one electrode to the other.

Electroluminescent diode structures can also be produced in accordance with the device shown in FIG. 5. The thin organic film can be obtained from a mixture of PMMA polymer at 30 g/l in 1,1,2-trichloroethane with the DCM molecule at 5% by mass of PMMA (1.5 g/l of solution). By following the procedure previously described for the photocell in FIG. 5, one can obtain organic films of 0.1 $\mu$m thickness. The aluminum electrodes are then deposited as previously described. The polarization of the device also takes place in the manner previously indicated.

The electroluminescent diode described emits red light at 620 nm through the transparent electrode when it is subjected to a voltage greater than 20 V (positive on the transparent electrode).

Different embodiment variations can be envisaged within the scope of this invention. Hence, the active organic layer can be produced by a mixture of different polymers and different molecules. Similarly, these different species can be chemically bonded (copolymer).

The transparent substrate can be ordinary glass but any other transparent dielectric material is suitable, for example transparent plastics like polycarbonate and PMMA. These plastic materials allow flexible devices to be produced (in a sheet, in a roll, etc. . . . ).

So as to allow the passage of useful light, at least one of the electrodes must be transparent. If, as in the case described, it is the substrate that is transparent, the electrode adjacent to this substrate can be made of indium oxide, mixed oxide of tin and indium or can be constituted by a thin film of conductive polymer, that is transparent within the range of useful light, for example of the polyaniline type (Pani, distributed by Monsanto) or PEDT (distributed by Bayer), or it may be constituted by a thin metal film (aluminum, gold, silver, . . . ) deposited by evaporation and with a thickness close to 50 nm.

The upper electrode is advantageously a thin metal film deposited by evaporation (aluminum, gold, silver, magnesium, . . . ). According to the type of device to be produced, this electrode can be opaque or semi-transparent.

There are different techniques that allow a static electric field to be applied to a thin film. One can polarize it using electrodes vaporized onto the substrate and then onto the film. This is the method used above. This field can also be applied by depositing ions, created by a Corona effect close to a spike or a metal wire, onto the film, which generally is highly resistive. This is the method that allows the cylinders of laser printers to be polarized. Polarization is also possible in the cold, when it is assisted optically.

The technique of polarization by electrodes consists of applying an electric field by using electrodes positioned on each side of the film. The lower electrode can simply be a conductive substrate (doped silicon for example), a metal electrode vaporized onto the substrate before the deposition of the organic film or a transparent electrode (ITO) according to the type of device to be produced. The upper electrode is a thin metal film deposited by vaporization.

Direct and accurate access to the value of the electric film applied to the film constitutes the essential advantage of this method. Furthermore, this is a method that can be applied to the device as it is being produced. By bringing the material to a temperature close to its vitreous transition temperature at the moment of polarization, the mechanical stresses imposed by the polymer chains that constitute the matrix are reduced and this leads to the orientation of the doping molecules. It is then necessary to maintain the static field during the sample cooling phase before switching off at ambient temperature in order to freeze the orientation of the molecules.

For certain molecule/polymer pairs, it is not necessary to heat the organic layer to orientate the molecules. This is the case for DR1 in PVK. For other molecule/polymer pairs, orientation can be carried out without heating by application of a beam of light that is absorbed by the molecules, this beam producing an effect equivalent to heating.

As has been previously stated, the polarization can also be carried out by a Corona effect. The application of an electrical potential on a metal surface with a small radius of curvature (a spike) results in the creation of a high charge density per unit area at the convex interface. The electric flux is therefore concentrated close to this spike, leading to ionization of a gas present close to the interface. The appearance of ions in the gas increases its conductivity and an electrical discharge appears when the voltage applied to the gas exceeds the dielectric breakdown voltage. Polarization by Corona effect consists of depositing these ions onto the thin film in order to polarize them. The substrates to be used are the same as those used for the preceding method. The upper metal electrode will then be deposited once the polarization has been carried out.

Figure 7:
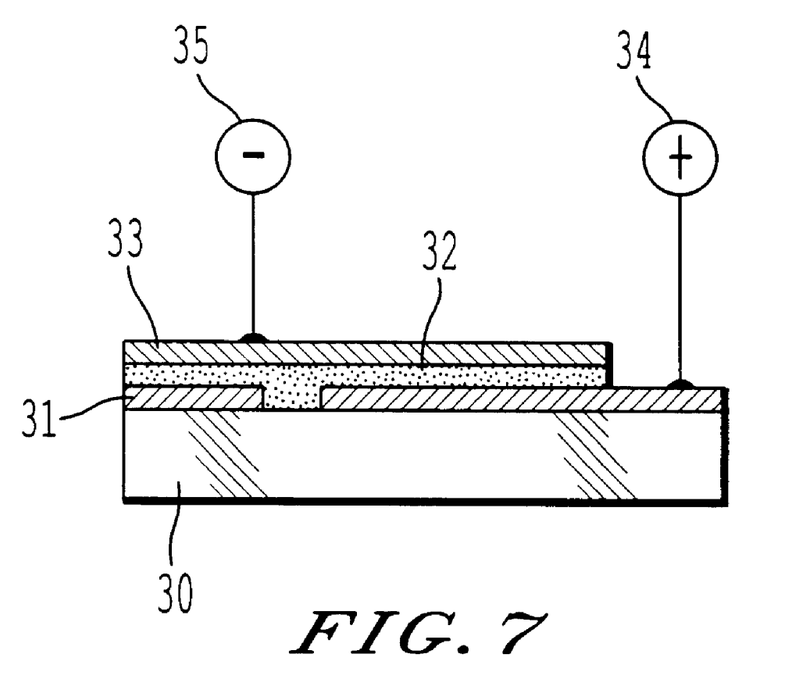
FIG. 7 represents a side view of a field effect transistor according to the present invention.

It is also possible to produce the devices described above with a reverse structure. In this case, the substrate and/or the lower electrode can be opaque. The upper electrode is then necessarily transparent or semi-transparent. It can be produced by cathodic deposition of ITO or by deposition of a thin metal film of thickness close to 10 to 50 nm (aluminum, gold, silver etc. . . . ). The advantage of such a type of device is that it can be produced by deposition on a flexible film of aluminum or Mylar® substrate (distributed by Dupont of Nemours). One then gains one production step; that relating to the deposition of the lower electrode. The production of semiconductor devices other than electroluminescent diodes or photovoltaic cells also comes within the scope of this invention; for example, field effect type transistors, such as the field effect transistor shown in FIG. 7, whose active semiconductor layer including a polymer layer 32 is constituted and/or produced according to the characteristics of the invention. In this case, the increase in the mobility of the charge carriers induced in accordance with the principle proposed is of great interest since the characteristics of the transistors (contrast between the on state and the off state) depends greatly on this. The interest in organic transistors is that they permit the production of sensors (detectors and dosimeters).

What is claimed is:

1. A semiconductor device comprising:

a polymer having at least one rectifying function produced by a layer of the polymer between first and second parallel electrodes, wherein:
the layer of the polymer includes a host matrix for polar molecules,
the polar molecules are oriented perpendicular to the first and second electrodes,
electrical charges of the polar molecules are aligned in a direction towards the first and second electrodes, and
said orientation of the polar molecules induces an electric field inside the layer of the polymer.

2. A device according to claim 1, wherein said polar molecules are molecules doping the host matrix.

3. device according to claim 1, wherein said polar molecules are molecules grafted into the host matrix.

4. A device according to claim 1, wherein said polar molecules have an electron acceptor group and an electron donor group separated by one or more groups comprising conjugated $\pi$ electron systems.

5. A device according to claim 1, wherein the host matrix is based on a polymer chosen from among polythiophene, polyparaphenylene, poly-paraphenylenevinylene, polymethyl methacrylate, polyvinyl carbazole, polycarbonate, polystyrene and polyvinyl chloride.

6. A device according to claim 1, further comprising:

a substrate supporting the first electrode,
wherein at least one of the substrate, the first electrode, and the second electrode is transparent.

7. A device according to claim 6, wherein the substrate supporting the first electrode comprises at least one of glass and plastic.

8. A device according to claim 1, comprising:

a conductive substrate used both as a support and as the first electrode.

9. A device according to claim 6, comprising:

a photocell, said polar molecules including molecules of 4-amino-4'-nitrobenzene.

10. A device according to claim 6, comprising:

an electroluminescent diode, said polar molecules including molecules of 4-(dicyanomethylene)-2-methyl-6-(p-dimethylaminostyryl)-4H-pyrane.

11. Use of the semiconductor device according to claim 1 as a diode.

12. Use of the semiconductor device according to claim 1 as an electroluminescent diode.

13. Use of the semiconductor device according to claim 1 as a photovoltaic diode.

14. Use of the semiconductor device according to claim 1 as an active semi-conductive layer for a field effect type transistor.

* * * * *

UNITED STATES PATENT AND TRADEMARK OFFICE
CERTIFICATE OF CORRECTION

PATENT NO. : 6,545,290 B2
DATED : April 8, 2003
INVENTOR(S) : Lorin et al.

It is certified that error appears in the above-identified patent and that said Letters Patent is hereby corrected as shown below:

<u>Title page,</u>
Item [76], should be deleted.
Item [75], should read:

-- [75]  Inventors:  André Lorin, Orsay; Céline Fiorini, Orsay; Jean-Michel Nunzi, Antony; Carole Sentein, Fontenay aux Roses, all of (FR) --

Insert Item [73], to read:

-- [73]  Assignee:  Commissariat A L'Energie Atomique, Paris (FR) --

Signed and Sealed this

Fifteenth Day of July, 2003

JAMES E. ROGAN
*Director of the United States Patent and Trademark Office*